US012593671B2

(12) United States Patent
Lv et al.

(10) Patent No.: US 12,593,671 B2
(45) Date of Patent: Mar. 31, 2026

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Kaimin Lv, Hefei (CN); Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 555 days.

(21) Appl. No.: 18/153,334

(22) Filed: Jan. 11, 2023

(65) Prior Publication Data

US 2024/0055325 A1     Feb. 15, 2024

Related U.S. Application Data

(63) Continuation of application No. PCT/CN2022/117380, filed on Sep. 6, 2022.

(30) Foreign Application Priority Data

Aug. 10, 2022     (CN) .......................... 202210957799.8

(51) Int. Cl.
*H01L 23/48*          (2006.01)
*H01L 23/495*        (2006.01)
*H01L 25/065*        (2023.01)

(52) U.S. Cl.
CPC ...... *H01L 23/481* (2013.01); *H01L 23/49575* (2013.01); *H01L 25/0657* (2013.01)

(58) Field of Classification Search
CPC ............. H01L 23/481; H01L 23/49575; H01L 25/0657; H01L 23/5286
See application file for complete search history.

(56) References Cited

U.S. PATENT DOCUMENTS 5,903,437 A * 5/1999 Pierson ............... H01L 23/3675
                                                         257/E23.098
6,059,939 A * 5/2000 Pierson ............... H01L 25/0657
                                                         438/758

(Continued)

FOREIGN PATENT DOCUMENTS

CN          101999167 A       3/2011
CN          109388595 A       2/2019

(Continued)

OTHER PUBLICATIONS

European Patent Office, Extended European Search Report Issued in Application No. 22924568.3, Jul. 22, 2024, Germany, 12 pages.

(Continued)

*Primary Examiner* — Laura M Menz
(74) *Attorney, Agent, or Firm* — Kilpatrick Townsend & Stockton LLP

(57)          ABSTRACT

Embodiments provide a semiconductor structure and a fabricating method. The semiconductor structure includes: a substrate having a power supply port; a memory module positioned on an upper surface of the substrate, where the memory module includes memory chips stacked in a first direction, the first direction is parallel to the upper surface of the substrate, each of the memory chips has a power supply signal line, at least one of the memory chips has a power supply wiring layer, the power supply signal line is electrically connected to the power supply wiring layer, the power supply wiring layer is positioned in the memory module, an end surface of the power supply wiring layer far away from the substrate is exposed by the memory module, and a solder bump is further provided on the end surface; and a lead frame electrically connected to the solder bump and the power supply port.

15 Claims, 6 Drawing Sheets

(56)  References Cited

U.S. PATENT DOCUMENTS

| | | | | |
|---|---|---|---|---|
| 6,156,165 | A * | 12/2000 | Pierson | H01L 25/0657 |
| | | | | 438/758 |
| 9,490,195 | B1 * | 11/2016 | Prabhu | H01L 24/82 |
| 9,728,524 | B1 * | 8/2017 | Tao | H01L 25/50 |
| 9,917,041 | B1 * | 3/2018 | Runyan | H01L 21/4825 |
| 11,183,484 | B2 * | 11/2021 | Okutsu | H01L 25/0657 |
| 11,417,642 | B2 * | 8/2022 | Sanuki | H01L 24/48 |
| 12,426,280 | B2 * | 9/2025 | Chuang | H01L 24/16 |
| 2011/0018119 | A1 | 1/2011 | Kim et al. | |
| 2012/0211878 | A1 | 8/2012 | Popovic et al. | |
| 2012/0233510 | A1 * | 9/2012 | Colgan | G11C 5/025 |
| | | | | 365/51 |
| 2014/0001639 | A1 * | 1/2014 | Hiraishi | H01L 25/0657 |
| | | | | 257/773 |
| 2014/0225248 | A1 | 8/2014 | Henderson et al. | |
| 2017/0162532 | A1 | 6/2017 | Kulick et al. | |
| 2018/0012864 | A1 * | 1/2018 | Brunschwiler | H05K 1/145 |
| 2018/0190635 | A1 * | 7/2018 | Choi | H01L 23/5386 |
| 2021/0143129 | A1 * | 5/2021 | Okutsu | H01L 24/92 |
| 2021/0272946 | A1 * | 9/2021 | Sanuki | G11C 16/30 |
| 2024/0055325 | A1 * | 2/2024 | Lv | H01L 25/065 |
| 2024/0055399 | A1 * | 2/2024 | Lv | H01L 23/5384 |
| 2024/0057350 | A1 * | 2/2024 | Chuang | H10B 80/00 |
| 2024/0057351 | A1 * | 2/2024 | Chuang | H01L 24/16 |
| 2024/0057352 | A1 * | 2/2024 | Chuang | H01L 24/02 |

FOREIGN PATENT DOCUMENTS

| | | | | | |
|---|---|---|---|---|---|
| CN | 109791925 | A | | 5/2019 | |
| CN | 111009518 | A | | 4/2020 | |
| CN | 112908945 | A | | 6/2021 | |
| CN | 113056819 | A | * | 9/2021 | G11C 5/14 |
| CN | 113345869 | A | * | 9/2021 | H01L 25/0657 |
| CN | 113690230 | A | | 11/2021 | |
| CN | 114255790 | A | | 3/2022 | |
| CN | 117636917 | A | * | 3/2024 | G11C 5/06 |
| CN | 117650132 | A | * | 3/2024 | H01L 21/60 |
| CN | 117650133 | A | * | 3/2024 | H01L 21/60 |
| CN | 117673013 | A | * | 3/2024 | G11C 5/06 |
| CN | 117677204 | A | * | 3/2024 | H01L 25/50 |
| CN | 117677205 | A | * | 3/2024 | H01L 23/50 |
| CN | 117677206 | A | * | 3/2024 | H01L 23/538 |
| CN | 117677207 | A | * | 3/2024 | H01L 23/488 |
| CN | 117650132 | B | * | 3/2025 | H01L 21/60 |
| EP | 4350767 | A1 | * | 4/2024 | H01L 23/49811 |
| EP | 4350767 | B1 | * | 6/2025 | H01L 25/0657 |
| JP | 2002501654 | A | * | 1/2002 | G11C 5/063 |
| JP | 6704165 | B1 | * | 6/2020 | G11C 5/14 |
| KR | 20010012720 | A | * | 2/2001 | G11C 11/4099 |
| WO | WO-9854727 | A2 | * | 12/1998 | G11C 5/063 |
| WO | WO-2024031769 | A1 | * | 2/2004 | G11C 5/06 |
| WO | WO-2021095083 | A1 | * | 5/2021 | G11C 5/025 |
| WO | WO-2021199447 | A1 | * | 10/2021 | H01L 23/50 |
| WO | WO-2024031767 | A1 | * | 2/2024 | H01L 21/60 |
| WO | WO-2024031768 | A1 | * | 2/2024 | H01L 21/60 |
| WO | WO-2024031773 | A1 | * | 2/2024 | H01L 23/50 |
| WO | WO-2024031774 | A1 | * | 2/2024 | H01L 23/488 |
| WO | WO-2024031775 | A1 | * | 2/2024 | H01L 25/50 |
| WO | WO-2025215497 | A1 | * | 10/2025 | |

OTHER PUBLICATIONS

ISA State Intellectual Property Office of the People's Republic of China, International Search Report Issued in Application No. PCT/CN2022/117380, Apr. 13, 2023 WIPO, 7 pages.

ISA State Intellectual Property Office of the People's Republic of China, International Search Report Issued in related Application No. PCT/CN2022/117386, Apr. 21, 2023 WIPO, 8 pages.

ISA State Intellectual Property Office of the People's Republic of China, International Search Report Issued in related Application No. PCT/CN2022/117375, Apr. 25, 2023 WIPO, 7 pages.

* cited by examiner

SEMICONDUCTOR STRUCTURE AND METHOD FOR FABRICATING SAME

CROSS-REFERENCE TO RELATED APPLICATION

This application is a continuation of PCT/CN2022/117380, filed on Sep. 6, 2022, which claims priority to Chinese Patent Application No. 202210957799.8 titled "SEMICONDUCTOR STRUCTURE AND METHOD FOR FABRICATING SAME" and filed on Aug. 10, 2022, the entire contents of which are incorporated herein by reference.

TECHNICAL FIELD

The present disclosure relates to the field of semiconductors, and more particularly, to a semiconductor structure and a method for fabricating the same.

BACKGROUND

To improve an integration level of a semiconductor structure, at least one memory chip may be placed in a same package structure. A high bandwidth memory (HBM) is a new type of memory. In a memory chip stacking technology represented by the HBM, an original one-dimensional memory layout is extended to a three-dimensional one. That is, a plurality of memory chips are stacked together and packaged, thereby greatly improving density of the memory chips, and achieving a large capacity and high bandwidth.

However, with increase of number of stacked layers, performance of the HBM needs to be improved.

SUMMARY

Embodiments of the present disclosure provide a semiconductor structure and a method for fabricating the same.

According to some embodiments of the present disclosure, an aspect of the embodiments of the present disclosure provides a semiconductor structure, which includes: a substrate having a power supply port; a memory module positioned on an upper surface of the substrate; and a lead frame. The memory module includes a plurality of memory chips stacked in a first direction, where the first direction is parallel to the upper surface of the substrate. Each of the memory chips has a power supply signal line, at least one of the memory chips has a power supply wiring layer, and the power supply signal line is electrically connected to the power supply wiring layer. The power supply wiring layer is positioned in the memory module, and an end surface of the power supply wiring layer far away from the substrate is exposed by the memory module. A solder bump is further provided on the end surface, and the lead frame is connected to the solder bump and is also electrically connected to the power supply port.

According to some embodiments of the present disclosure, another aspect of the embodiments of the present disclosure also provides a method for fabricating a semiconductor structure. The method includes: providing a substrate having a power supply port; providing a memory module, where the memory module includes a plurality of memory chips stacked in a first direction, each of the plurality of memory chips has a power supply signal line, at least one of the plurality of memory chips has a power supply wiring layer, the power supply signal line is electrically connected to the power supply wiring layer, the power supply wiring layer is positioned in the memory module, an end surface of the power supply wiring layer far away from the substrate is exposed by the memory module, a solder bump is further provided on the end surface; fixing the memory module to the substrate, where the first direction is parallel to the upper surface of the substrate; providing a lead frame; and connecting the lead frame to the solder bump, and electrically connecting the lead frame to the power supply port.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figures 1, 2:
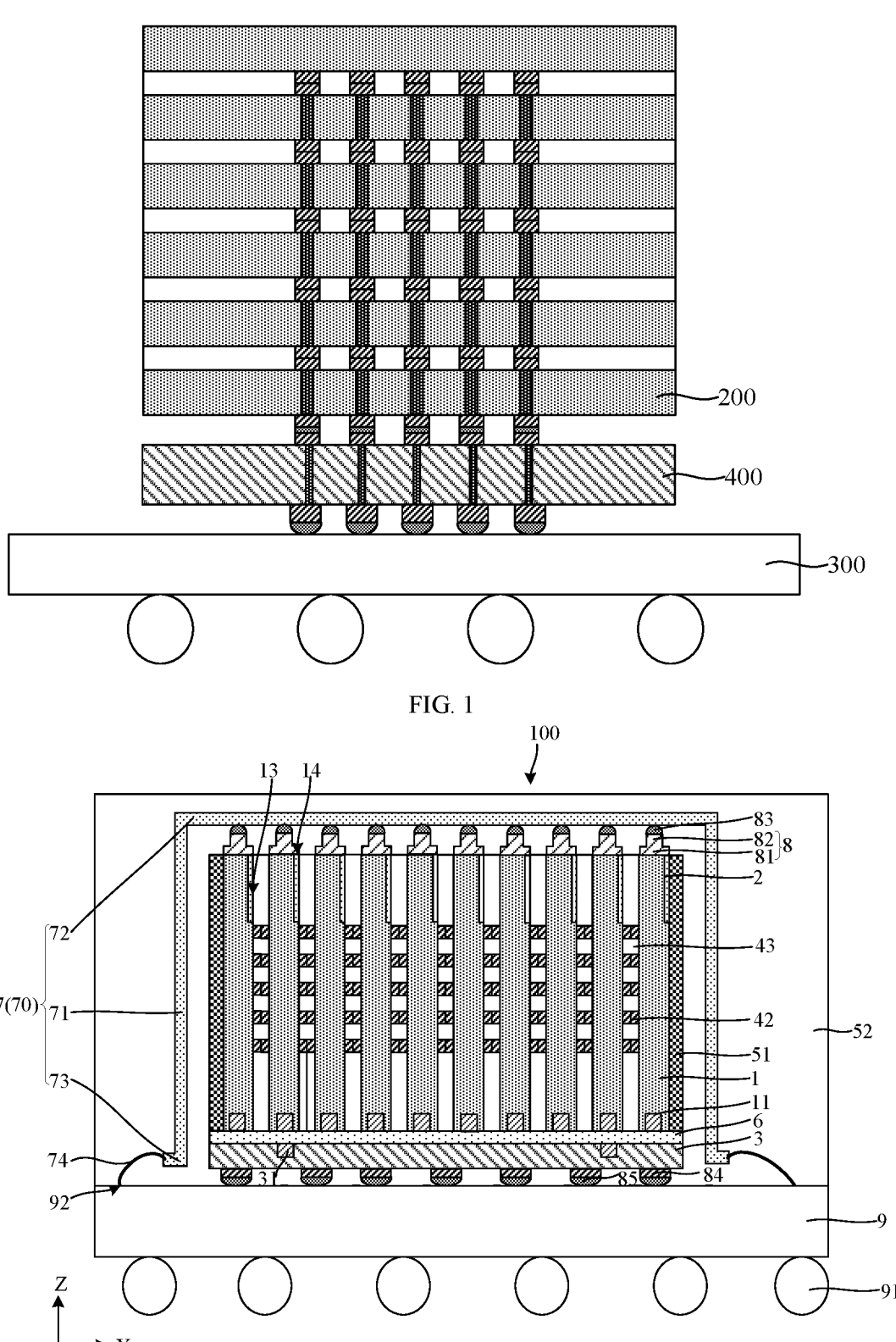
FIG. 1 shows a schematic diagram of a semiconductor structure.
FIGS. 2 to 6 respectively show sectional views of different semiconductor structures provided by an embodiment of the present disclosure.

Referring to FIG. 1, a high bandwidth memory (HBM) adopts a parallel stacking mode where front surfaces of a plurality of memory chips 200 are parallel to an upper surface of a substrate 300. That is, an arrangement direction of the plurality of memory chips 200 is perpendicular to the upper surface of the substrate 300. When number of stacked layers is larger, a communication distance between the memory chip 200 at the uppermost layer and a logic chip 400 has larger difference from a communication distance between the memory chip 200 at the lowermost layer and the logic chip 400, resulting in larger difference between communication delay of different memory chips 200 and communication delay the logic chip 400, which has a negative effect on an operating speed of a product. In addition, a power supply mode of a semiconductor structure may also have an effect on its performance.

Embodiments of the present disclosure provide a semiconductor structure, where a plurality of memory chips are stacked in a direction parallel to an upper surface of a substrate. That is, an arrangement direction of the plurality of memory chips is parallel to the upper surface of the substrate. Therefore, the plurality of memory chips have an equal communication distance, which is advantageous to unifying communication delay and increasing operating speed. In addition, a power supply wiring layer can change a layout of power supply signal lines and lead the power supply signal lines out of a memory module. That is, reliability of power supply can be improved by means of wired power supply. In addition, a solder bump causes connection between a lead frame and a memory module to be firmer, and the lead frame can specify layout of a power supply path, thereby ensuring stability of power supply.

The embodiments of the present disclosure will be described in detail below in conjunction with the accompanying drawings. However, a person of ordinary skill in the art may understand that in the embodiments of the present disclosure, many technical details are put forward such that a reader may better understand the embodiments of the present disclosure. However, the technical solutions requested to be protected by the embodiments of the present disclosure may also be implemented even without these technical details or various variations and modifications based on the following embodiments.

As shown in FIGS. 2 to 9, an embodiment of the present disclosure provides a semiconductor structure, which includes: a substrate 9 having a power supply port 92; a memory module 100 positioned on an upper surface of the substrate 9; and a lead frame 7. The memory module 100 includes a plurality of memory chips 1 stacked in a first direction X, where the first direction X is parallel to the upper surface of the substrate 9. Each of the memory chips 1 has a power supply signal line 12, at least one of the memory chips 1 has a power supply wiring layer 2, and the power supply signal line 12 is electrically connected to the power supply wiring layer 2. The power supply wiring layer 2 is positioned in the memory module 100, and an end surface 14 of the power supply wiring layer 2 far away from the substrate 9 is exposed by the memory module 100. A solder bump 8 is further provided on the end surface 14, and the lead frame 7 is connected to the solder bump 8 and is also electrically connected to the power supply port 92.

Such design at least includes following effects.

First, the power supply wiring layer 2 may lead out the power supply signal line 12, to provide wired power supply to the memory chip 1, thereby improving the stability of power supply. In some embodiments, the surface of the memory chip 1 includes a front surface and a back surface opposite to each other, and a side surface connected between the front surface and the back surface, where an area of the front surface and an area of the back surface are larger than that of the side surface. A plane where the power supply wiring layer 21 is positioned is perpendicular to the upper surface of the substrate 9. That is, the power supply wiring layer 21 may be positioned on the front surface or the back surface of the memory chip 1 to connect the power supply signal line 12.

Second, the solder bump 1 not only can electrically connect the power supply wiring layer 2 to the lead frame 7, but also can fix the lead frame 7, thereby improving structural strength.

Third, the lead frame 7 is not easily deformed due to higher strength, such that a direction of a wired power supply path can be specified.

Fourth, the plurality of memory chips 1 are stacked along the first direction X. That is, the arrangement direction of the plurality of memory chips 1 is parallel to the substrate 9. In this way, the side surface of the memory chip 1 faces toward the substrate 9. Because the area of the side surface of the memory chip 1 is smaller, an occupied area of the upper surface of the substrate 9 is smaller, which is advantageous to increasing number of the memory chips 1 stacked.

The semiconductor structure will be described in detail below with reference to the accompanying drawings.

First, it is to be noted that the semiconductor structure has the first direction X, a second direction Y, and a third direction Z. The first direction X is the stacking direction of the memory chips 1, the second direction Y is perpendicular to the first direction X and is parallel to the upper surface of the substrate 9, and the third direction Z is perpendicular to the upper surface of the substrate 9.

Referring to FIGS. 2 to 6, the plurality of memory chips 1 may be stacked in a hybrid bonding manner. For example, a dielectric layer 43 is further provided on the surface of each of the memory chips 1, and the dielectric layers 43 of the adjacent memory chips 1 may be connected together by an acting force such as a molecular force. In addition, a bonding portion 42 may also be provided on the surface of each of the memory chips 1, and the adjacent bonding portions 42 are bonded and connected together under a heating condition. That is, the dielectric layer 43 is made of an insulating material and can play an isolation role; and the bonding portion 42 is made of a conductive material and can play an electrical connection role. In addition, the dielectric layer 43 also exposes an end surface 4 of the power supply wiring layer 2 facing away from the substrate 9 and covers the surface of the power supply wiring layer 2 except the end surface 4.

The memory chip 1 may be a chip such as a dynamic random access memory (DRAM) or a static random-access memory (SRAM). In some embodiments, the adjacent memory chips 1 may all be stacked in the manner that the front surface faces the back surface, which is advantageous to unifying the step of bonding the memory chips 1, such that the production process is simpler. In some embodiments, the adjacent memory chips 1 may also be stacked in a manner where the front surface faces the front surface or the back surface faces the back surface. The front surface of the memory chip 1 may also be understood as an active surface 13, and the back surface of the memory chip 1 may be understood as an inactive surface opposite to the active surface 13.

The power supply wiring layer 2 and the power supply signal line 12 will be described in detail below.

Referring to FIGS. 2 to 6, the power supply wiring layer 2 may be positioned on the front surface of the memory chip 1. That is, the power supply wiring layer 2 extends along the active surface 13 of the memory chip 1. Therefore, the power supply wiring layer 2 may be fabricated by means of the original back-end process after the fabrication of the components in the memory chip 1 is completed, such that the process is simpler. In addition, the power supply wiring layer 2 may extend only at the edge position close to a side of the active surface 13 of the memory chip 1 without covering the active surface 13 of the entire memory chip 1, so the contact area between the power supply wiring layer 2 and the memory chip 1 is small, which reduces the influence of heat generation of the power supply wiring layer 2 on the memory chip 1.

Figures 7, 8:
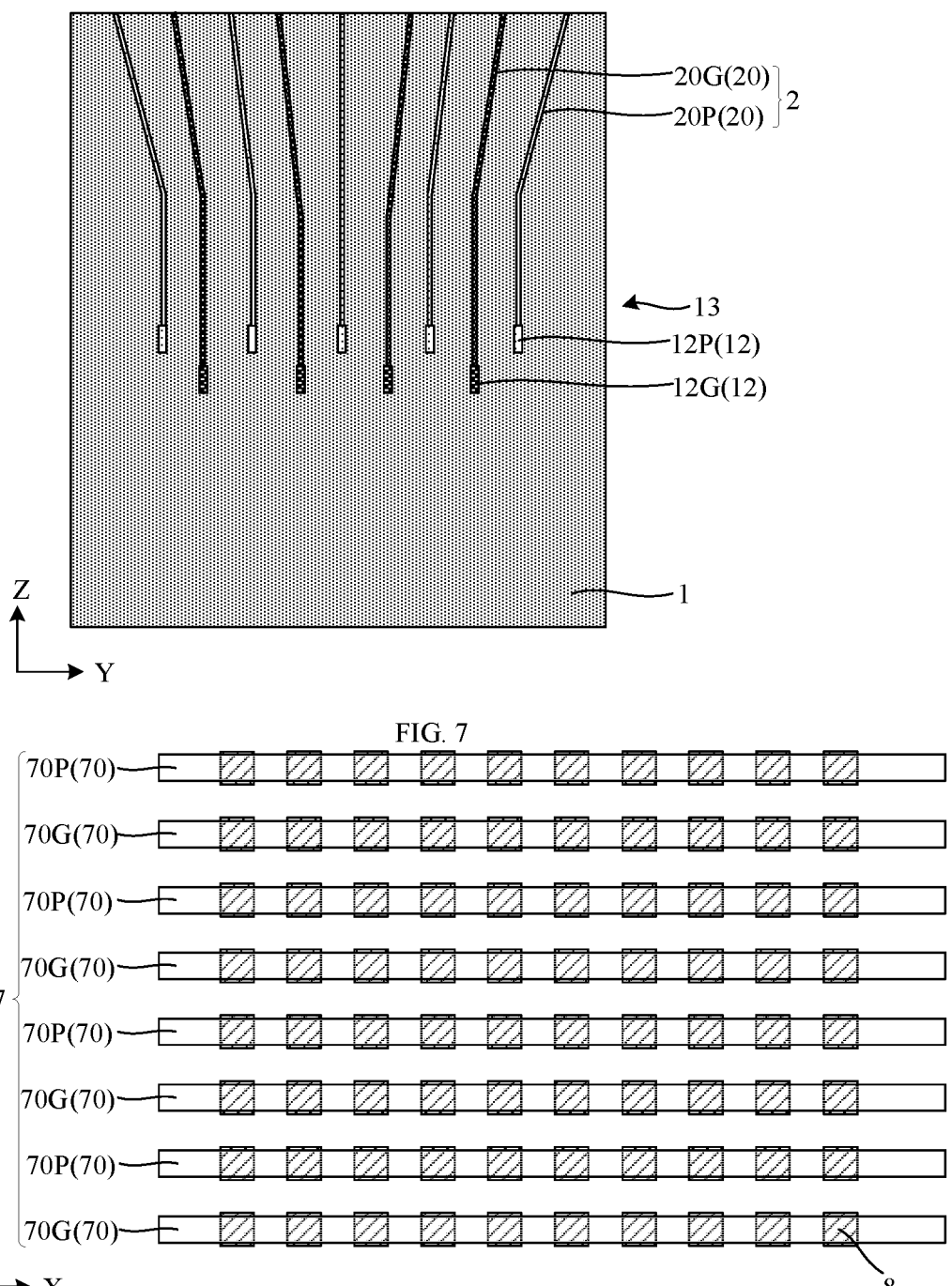
FIG. 7 shows a schematic diagram of an active surface of a memory chip provided by an embodiment of the present disclosure.
FIG. 8 to FIG. 9 respectively show vertical views of different semiconductor structures provided by an embodiment of the present disclosure.

Referring to FIG. 7 that is the schematic diagram of the active surface 13 of the memory chip 1, each memory chip 1 has the plurality of power supply signal lines 12, and the power supply signal line 12 extends from the inside of the memory chip 1 to the active surface 13 to be connected to the power supply wiring layer 2. Different power supply signal lines 12 may provide different voltage signals such as digital signals or analog signals for the components in the memory chip 1. The power supply signal line 12 may be the ground signal line 12G or the power signal line 12P. Different ground signal lines 12G have different voltage signals, and different power signal lines 12P have different voltage signals.

Each power supply wiring layer 2 includes the plurality of power supply wirings 20 arranged at intervals, where a power supply wiring 20 is electrically connected to a power supply signal line 12, different power supply signal lines 12 have different voltage signals, and correspondingly, different power supply wirings 20 have different voltage signals. The power supply wiring layer 2 includes a ground wiring 20G and a power wiring 20P, where the ground wiring 20G is electrically connected to the ground signal line 12G, and the power wiring 20P is electrically connected to the power signal line 12P.

In some embodiments, referring to FIG. 2 and FIG. 4 to FIG. 6, each memory chip has one power supply wiring layer 2, and the power supply wiring layer 2 in each memory chip 1 is correspondingly connected to the power supply signal line 12. That is, the power supply signal lines 12 of different memory chips 1 are independent of each other and do not need to be electrically connected together by means of a conductive via 41 and the bonding portion 42; and the power supply signal line 12 in each memory chip 1 may be led out by the power supply wiring layer 2 of the memory chip 1 without the power supply wiring layer 2 of other memory chip 1. Because the power supply signal line 12 of each memory chip 1 may be separately led out, it is advantageous to improving the stability of power supply. In addition, the step of fabricating the conductive via 41 (referring to FIG. 3) may be omitted, thereby reducing production costs. In addition, because the plurality of memory chips are independent of each other, no bonding portion 42 may be arranged between the adjacent memory chips 1.

FIG. 8 is a vertical view of the semiconductor structure shown in FIG. 2 and FIG. 4 to FIG. 6. To be more intuitive, only the lead frame 7 and the solder bump 8 are shown in FIG. 8. Referring to FIG. 8, because each memory chip 1 has the power supply wiring layer 2, correspondingly, each memory chip 1 also has the solder bump 8. That is, number of the solder bumps 8 is larger, so strength of connection between the lead frame 7 and the memory module 100 may be enhanced, thereby improving the stability of the structure.

Figure 3:
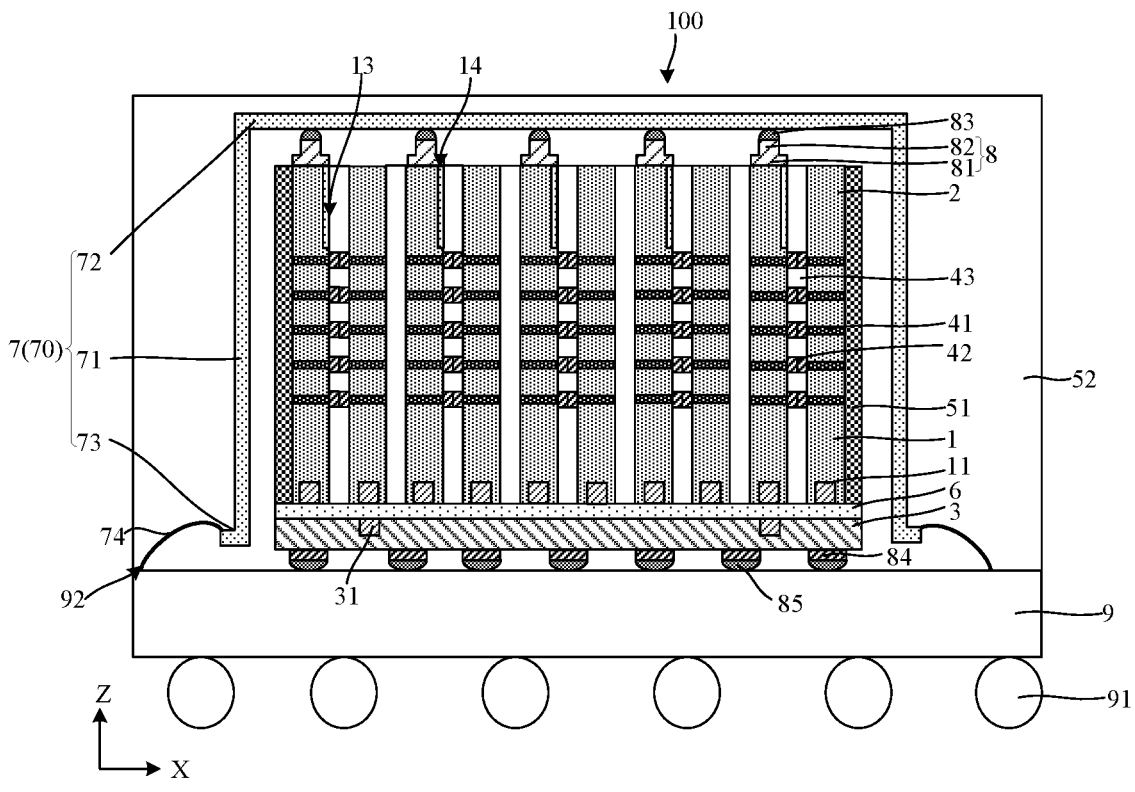

In some other embodiments, referring to FIG. 3, the number of the power supply wiring layers 2 may also be less than that of the memory chips 1. In some embodiments, the conductive via 41 is provided in the memory chip 1, where the conductive via 41 is connected to the power supply signal line 12; and the bonding portion 42 is provided between the adjacent memory chips 1, where the bonding portion 42 is connected to the conductive via 41 in the adjacent memory chips 1. That is, the power supply signal lines 12 having the same voltage signal in different memory chips 1 may be connected together by means of the conductive vias 41 and the bonding portions 42. For example, the power supply signal lines 12 having the same voltage signal in two adjacent memory chips 1 are electrically connected to each other, such that only one of the two memory chips 1 needs to have the power supply wiring layer 2.

That is, the plurality of memory chips 1 may share one power supply wiring layer 2. When one memory chip 1 has the power supply wiring layer 2, the power supply signal line 12 of the memory chip 1 may be directly connected to its own power supply wiring layer 2. That is, the power supply signal line 12 is led out by its own power supply wiring layer 2. When one memory chip 1 does not have the power supply wiring layer 2, the memory chip 1 may be electrically connected to other memory chip 1 by means of the conductive via 41 and the bonding portion 42, such that the power supply signal line 12 is led out by the power supply wiring layer 2 of the other memory chip 1.

Figure 9:
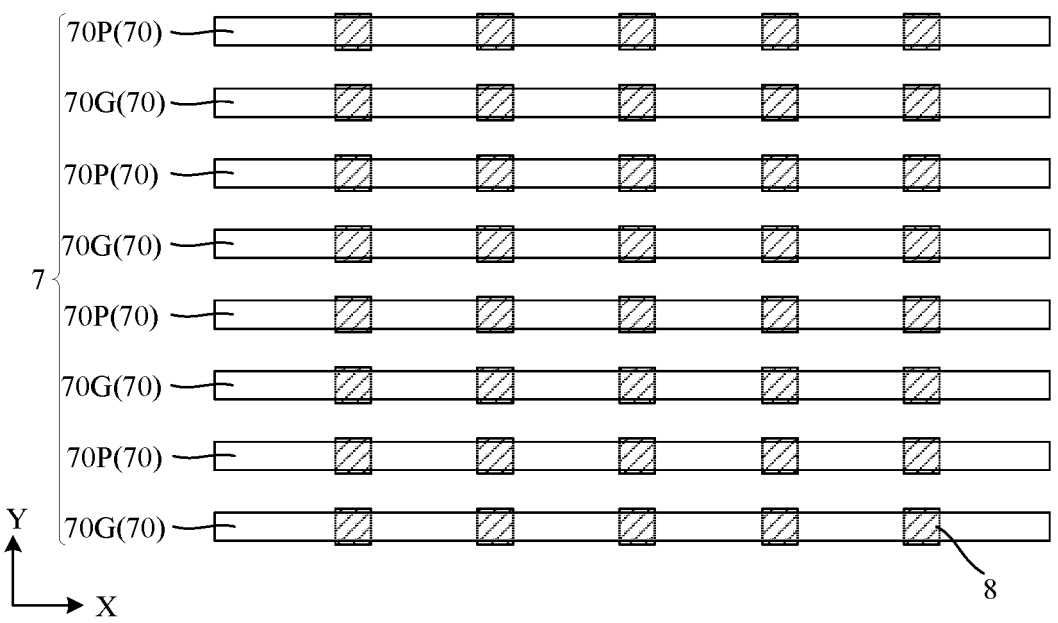

FIG. 9 is a vertical view of the semiconductor structure shown in FIG. 3. To be more intuitive, FIG. 9 only shows the lead frame 7 and the solder bump 8. Referring to FIG. 9, because the plurality of memory chips 1 may share one power supply wiring layer 2, the number of the power supply wiring layers 2 is smaller, and correspondingly, the number of the solder bumps 8 is smaller, such that spacing between the adjacent solder bumps 8 may be increased to avoid wrong electrical connection between the adjacent solder bumps 8.

The lead frame 7 will be described in detail below.

Referring to FIG. 8 and FIG. 9, the lead frame 7 includes a plurality of frame strips 70 arranged at intervals, and the plurality of frame strips 70 are arranged in the second direction Y, where the second direction Y is perpendicular to the first direction X and is parallel to the upper surface of the substrate 9. Each of the power supply wiring layers 2 comprises a plurality of power supply wirings 20, and different power supply wirings 20 have different voltages. Different frame strips 70 are connected to the power supply wirings 20 having the different voltages.

The solder bumps 8 having the same voltage signal may be aligned in the first direction X. That is, the power supply wirings 20 having the same voltage signal in the plurality of power supply wiring layers 2 directly face each other in the first direction X. In this way, orthographic projections of the frame strips 70 on the substrate 9 may be linear, thereby facilitating the alignment of the frame strips 70 to the solder bumps 8, simplifying the soldering processes, and saving materials of the frame strips 70.

With continued reference to FIG. 8 and FIG. 9, each of the plurality of frame strips 70 includes a ground frame strip 70G and a power frame strip 70P, where the ground frame strip 70G is electrically connected to the ground wiring 20G, and the power frame strip 70P is electrically connected to the power wiring 20P. In some embodiments, the ground frame strip 70G and the power frame strip 70P are alternately arranged in the second direction Y. Accordingly, the ground wiring 20G and the power wiring 20P are alternately arranged in the second direction Y. In this way, it is advantageous to reducing electromagnetic interference between adjacent power supply wiring 20 and adjacent frame strips 70.

In some embodiments, the plurality of frame strips 70 are arranged at equal intervals, which is advantageous to improving structural uniformity and avoiding erroneous electrical connection between adjacent frame strips 70 due to smaller distance.

Referring to FIGS. 2 to 6, the lead frame 7 includes support frames 71 and a solder frame 72 connected to each other, where the support frames 71 extend in a direction perpendicular to the upper surface of the substrate 9, and the solder frame 72 extends in a direction parallel to the upper surface of the substrate 9 and is soldered to the solder bump 8. That is, the solder bump 8 may fix the solder frame 72 above the memory module 100, such that the memory module 100 can support the lead frame 7 to improve the stability of the structure.

In some embodiments, there are at least two support frames 71, which are respectively positioned on opposite two sides of the memory module 100 and are connected to opposite two ends of the solder frame 72, respectively. The plurality of support frames 71 are advantageous to improving the stability of the lead frame 7, thereby improving the reliability of power supply. In some other embodiments, the lead frame 7 may also have one support frame 71, which is advantageous to saving materials.

Figure 5:
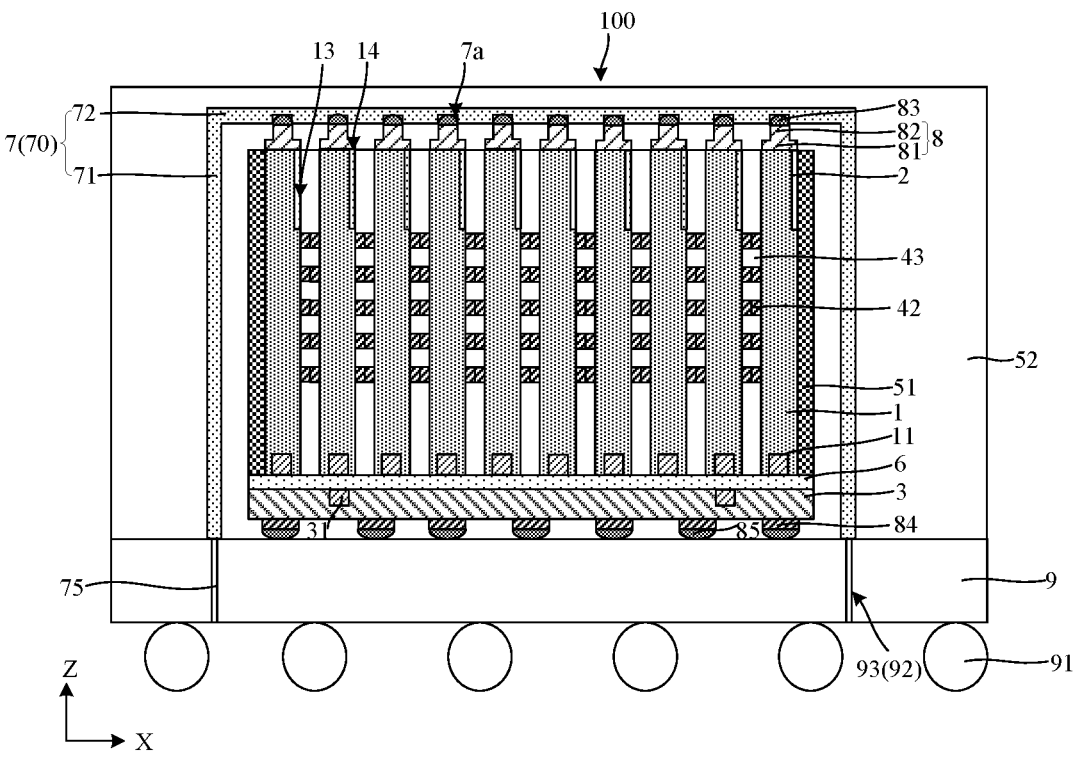
Figure 6:
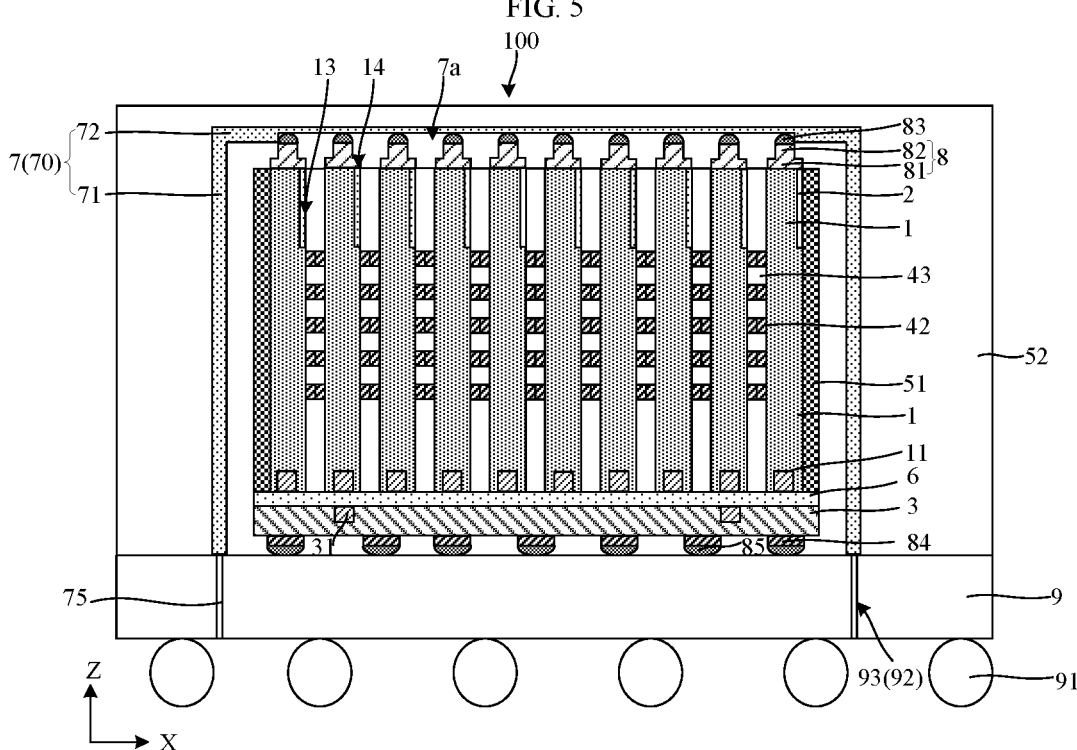

Referring to FIG. 5 to FIG. 6, a groove 7a may also be provided in the lead frame 7, and the solder bump 8 directly faces and is soldered to the groove 7a. That is, the groove 7a is positioned in the solder frame 72. It is to be noted that a solder layer 83 is further provided on the top surface of the solder bump 8 to connect the solder bump 8 and the lead frame 7. The groove 7a may accommodate more solders to improve the soldering strength and reduce the resistance of contact between the solder bump 8 and the lead frame 7.

In some embodiments, a width of the solder frame 72 in the second direction Y may be greater than that of the solder bump 8 in the second direction Y, and an opening area of the groove 7a is larger than a top surface area of the solder bump 8. In this way, solder capacity is larger and soldering firmness is better; and in addition, the larger opening facilitates the alignment of the solder bump 8 to the groove 7a. In some other embodiments, the width of the solder frame 72 in the second direction Y may also be less than or equal to that of the solder bump 8.

In some embodiments, referring to FIG. 5, each frame strip 70 has a plurality of grooves 7a, and the plurality of grooves 7a are in one-to-one correspondence with the plurality of solder bumps 8. In this way, the groove 7a may guide a flow direction of the solder during soldering. That is, the groove 7a guides the solder to flow toward inside the groove 7a, thereby avoiding electrical connection between the adjacent solder bumps 8.

In some other embodiments, referring to FIG. 6, each frame strip 70 has one groove 7a, one groove 7a corresponds to the plurality of solder bumps 8, and the groove 7a extends in the first direction X. In this way, the production process is simpler.

In addition, in some embodiments, the groove 7a may penetrate through the lead frame 7, such that the groove 7a accommodates more solders. In some other embodiments, a bottom surface of the groove 7a may be positioned in the lead frame 7. That is, the groove 7a does not penetrate through the lead frame 7, such that the bottom surface of the groove 7a may also be in contact with the solder, thereby increasing the contact area to reduce the contact resistance.

Referring to FIG. 2 and FIG. 3, the lead frame 7 further includes extension frames 73 connected to side surfaces of the support frames 71 far away from the solder frame 72. A sectional area of each of the extension frames 73 is larger than that of each of the support frames 71, and both sections of the extension frames 73 and sections of the support frames 71 are parallel to the upper surface of the substrate 9. The semiconductor structure further comprises lead wires 74 connected between the extension frames 73 and the power supply port 92.

That is, the extension frame 73 extends in a direction parallel to the upper surface of the substrate 9, and the extension frame 73 is advantageous to increasing the soldering area between the lead wires 74 and the lead frame 7 to facilitate soldering. In addition, the lead wires 74 can improve flexibility of connection between the lead frame 7 and the power supply port 92.

In some embodiments, head and tail ends of the extension frame 73, of the support frame 71, and of the solder frame 72 are connected in sequence. That is, one strip-shaped conductive material is bent into a plurality of sections to respectively serve as the extension frame 73, the support frame 71, and the solder frame 72, such that the production process is simpler.

Figure 4:
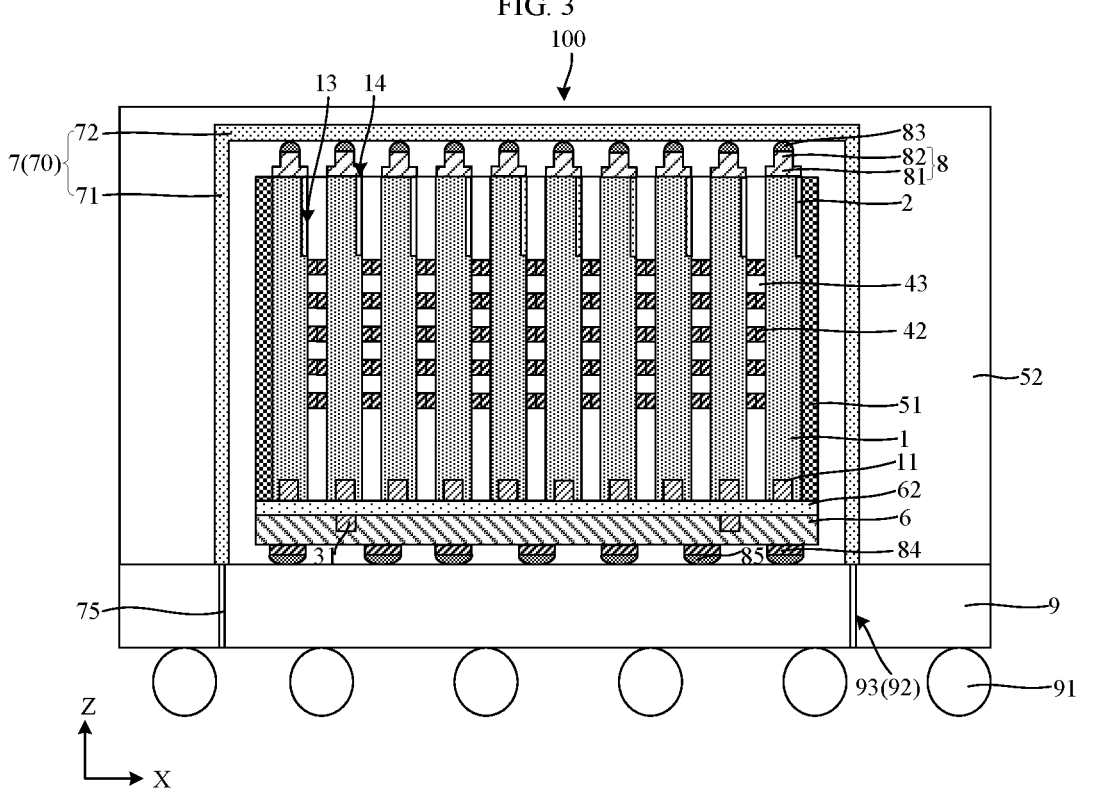

In some other embodiments, referring to FIGS. 4 to 6, the semiconductor structure further includes power supply lines 75 respectively connected to side surfaces of the support frames 71 far away from the solder frame 72. The substrate 9 further has a first via 93 penetrated, the first via 93 serves as the power supply port 92, and the power supply lines 75 are arranged in the first via 93. In this way, a mode of connection between the lead frame 7 and the power supply port 92 is simpler. In addition, because the side surfaces of the power supply lines 75 are surrounded by the first via 93, the area of contact between the power supply lines 75 and the first via 93 is larger, and thus the contact resistance is smaller.

The sectional area of the power supply line 75 is smaller than that of the support frame 71, and the section of the power supply line 75 and the section of the support frame 71 are both parallel to the upper surface of the substrate 9. When the sectional area of the support frame 71 is larger, it is advantageous to improving the structural strength of the lead frame 7; and when the sectional area of the power supply line 75 is smaller, it is advantageous to reducing the volume occupied by the power supply line 75 in the substrate 9, thereby avoiding occupying spatial position of other component in the substrate 9.

It is worth noting that because the lead frame 7 includes a plurality of frame strips 70 arranged at intervals, it is to be understood that each frame strip 70 may include a structure such as the solder frame 72, the support frame 71, or the extension frame 73.

Referring to FIGS. 2 to 6, the solder bump 8 includes a first bump 81 and a second bump 82 arranged in stack, where the first bump 81 is connected to the power supply wiring layer 2, and the second bump 82 is soldered to the lead frame 7. A sectional area of the first bump 81 is larger than a sectional area of the second bump 82, and both a section of the first bump 81 and a section of the second bump 82 are parallel to the upper surface of the substrate 9.

The first bump 81 has a larger sectional area, which is advantageous to increasing the area of contact between the solder bump 8 and the power supply wiring layer 2, to reduce the contact resistance. The second bump 82 has a smaller sectional area, which is advantageous to increasing the distance between the adjacent solder bumps 8 to avoid an erroneous electrical connection between the adjacent solder bumps 8.

For example, in the first direction X, a ratio of a width of the first bump 81 to a width of each of the plurality of memory chips 1 ranges from 0.8 to 1.2. When the width of the first bump 81 and the width of each of the plurality of memory chips 1 are kept within the above range, it is advantageous to ensuring that the solder bumps 8 have a sufficient contact area with the power supply wiring layer 2, and that a proper distance is provided between the adjacent solder bumps 8, to avoid wrong electrical connection between the adjacent solder bumps 8.

With continued reference to FIGS. 2 to 6, the semiconductor structure further includes a first sealing layer 51, which surrounds the memory module 100 and exposes a surface of the memory module 100 away from the substrate 9. The first sealing layer 51 can protect the memory module 100 from being adversely affected by external environment such as external moisture or solvent, and can resist thermal shock and mechanical vibration when the semiconductor structure is installed.

The semiconductor structure further includes a second sealing layer 52, which may cover the memory module 100, the lead frame 7, the solder bump 8, and the first sealing layer 51. The second sealing layer 52 may fix the solder bump 8 and the lead frame 7 to ensure structural strength. That is, the second sealing layer 52 can improve protection and isolation effects to ensure the performance of the semiconductor structure.

In one embodiment, a material of the first sealing layer 51 may be the same as a material of the second sealing layer 52. For example, the first sealing layer 51 and the second sealing layer 52 may be epoxy resin.

In one embodiment, the material of the first sealing layer 51 may be different from the material of the second sealing layer 52. For example, a thermal conductivity of the second sealing layer 52 is higher than that of the first sealing layer 51. Based on such arrangement, heat introduced into the second sealing layer 52 through the lead frame 7 may be transferred to the external environment more quickly, such that adverse effects of high temperature environment on the memory module 100 are reduced.

Referring to FIGS. 2 to 6, the semiconductor structure further includes: a logic chip 3 positioned between the substrate 9 and the memory module 100, where the logic chip 3 has a first wireless communication portion 31, each of the plurality of memory chip 1 has a second wireless communication portion 11, and the second wireless communication portion 11 is configured to perform wireless communication with the first wireless communication portion 31.

Because distances between the plurality of memory chips 1 and the logic chip 3 are equal, delays of wireless communication between the plurality of memory chips 1 and the logic chip 3 are kept consistent. In some embodiments, the second wireless communication portion 11 is positioned on a side of the memory chip 1 facing the logic chip 3. In this way, the distance between the first wireless communication portion 31 and the second wireless communication portion 11 may be reduced, thereby improving the quality of wireless communication.

It is to be noted that when the arrangement direction of the plurality of memory chips 1 is perpendicular to the upper surface of the logic chip 3, the communication delays between the memory chips 1 at different layers and the logic chip 3 have larger difference. In addition, with the increase of the number of layers, the number of through-silicon vias (TSV) for communication may increase in direct proportion, thereby sacrificing an area of a wafer. In the embodiments of the present disclosure, the stacking direction and the communication mode of the memory chip 1 are changed, which is advantageous to improving the communication quality and saving the area of the wafer.

With continued reference to FIGS. 2 to 6, the side surface of the memory chip 1 is arranged close to the logic chip 3, and the area of the side surface is smaller. In the wireless communication mode, the wired communication portion does not need to be arranged between the memory chip 1 and the logic chip 3, such that the process difficulty may be reduced, and sufficient spatial position may be provided for the connection structure between the memory chip 1 and the logic chip 3, to improve the structural strength between the memory chip 1 and the logic chip 3. In addition, a lower side of the memory module 100 is configured for performing wireless communication, and an upper side of the memory module 100 is configured for arranging the wired power supply path, such that the electromagnetic interference caused by the current in the wired power supply path to a coil in the wireless communication portion can be reduced to avoid signal loss.

In some embodiments, a bonding layer 6 is further provided between the memory module 100 and the logic chip 3. That is, the memory module 100 and the logic chip 3 are connected together by means of gluing to constitute one memory core. For example, the bonding layer 6 may be a die attach film (DAF). The bonding process is simpler, and the costs can be saved. In addition, metal ions may be doped in the bonding layer 6 to improve a heat dissipation effect of the memory module 100 and the logic chip 3. In some other embodiments, a soldered layer (not shown in figure) may be provided between the memory module 100 and the logic chip 3. That is, the memory module 100 and the logic chip 3 are connected together by means of soldering.

That is, the power supply signal line 12 is led out from an upper part of the memory module 100, such that the sufficient spatial position can be left below the memory module 100 to connect the logic chip 3, thereby improving the structural strength.

With continued reference to FIGS. 2 to 6, a bonding pad 84 and a solder paste layer 85 are further provided between the logic chip 3 and the substrate 9. That is, the logic chip 3 is soldered on the substrate 9 by means of flip-chip bonding. In this way, the substrate 9 may perform power supply and signal exchange on the logic chip 3 in the wired mode with higher reliability. In addition, a solder ball 91 is further provided at the bottom of the substrate 9, such that the semiconductor structure may be connected to a peripheral device.

In conclusion, in the embodiments of the present disclosure, an upper side of the memory module 100 is connected by using the solder bump 8, such that the stability of connection between the lead frame 7 and the memory module 100 is higher. A lower side of the memory module 100 is connected by using the lead wire 74 or the power supply line 75, such that the structure is simple and the flexibility is higher. The two connection modes are matched to cause the wired power supply path to be flexible and stable.

Figure 10:
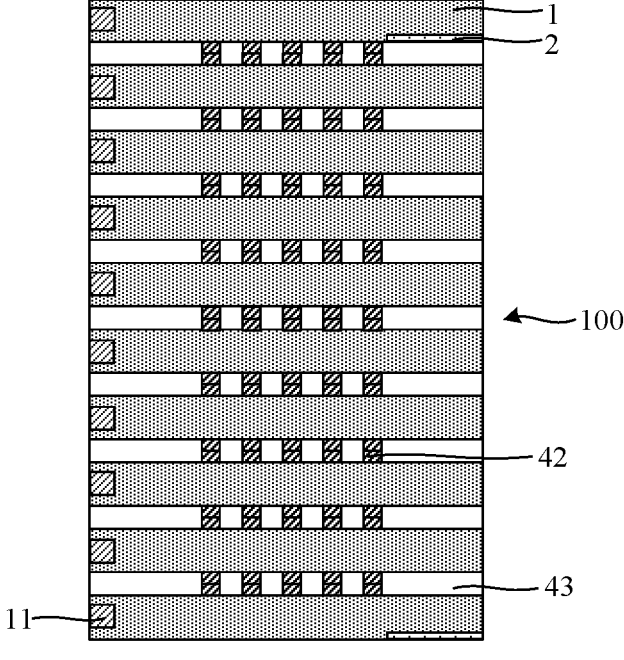
FIG. 10 to FIG. 11 show schematic structural diagrams corresponding to steps in a method for fabricating a semiconductor structure provided by another embodiment of the present disclosure.
Figure 11:
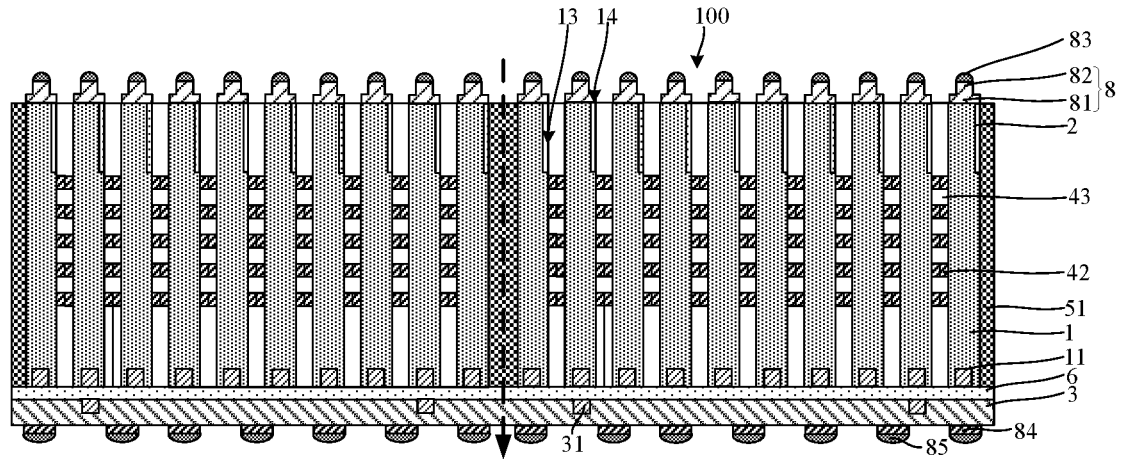

As shown in FIG. 10, FIG. 11 and FIG. 2, another embodiment of the present disclosure provides a method for fabricating a semiconductor structure, where this method may be used for fabricating the semiconductor structure provided in the preceding embodiments. Reference may be made to the foregoing embodiments for a detailed description of the semiconductor structure.

Referring to FIG. 10 and FIG. 11, a memory module 100 is provided, and the memory module 100 includes a plurality of memory chips 1 stacked in the first direction X. Each of the plurality of memory chips 1 has a power supply signal line 12, at least one of the plurality of memory chips 1 has a power supply wiring layer 2, the power supply signal line 12 is electrically connected to the power supply wiring layer 2, the power supply wiring layer 2 is positioned in the memory module 100, an end surface 14 of the power supply wiring layer 2 far away from the substrate 9 is exposed by the memory module 100, and a solder bump 8 is further provided on the end surface 14.

In some embodiments, referring to FIG. 10, the plurality of memory chips 1 are provided; and the power supply wiring layer 2 is formed on at least one of the plurality of memory chips 1, and after the power supply wiring layer 2 is formed, the plurality of memory chips 1 are stacked. For example, the power supply signal line 12 of the memory chip 1 of each layer is led out to the edge of the memory chip 1 via the power supply wiring layer 2, and the memory chips 1 of multiple layers are stacked in the hybrid bonding manner. It is to be noted that the memory chip 1 is horizontally placed during bonding.

Referring to FIG. 11, the memory module 100 is rotated 90°, such that each memory chip 1 is perpendicular to the logic chip 3, and the memory chip 1 and the logic chip 3 are fixed via the DAF. The plurality of memory modules 100 are reconstructed by means of a first molding process to form the reconstructed wafer, and the first bump 81 is processed on the top surface of the reconstructed wafer by means of a rewiring process. Next, the second bump 82 is formed on the first bump 81, the first bump 81 and the second bump 82 constitute the solder bump 8, and the solder layer 83 is formed on the solder bump 8. Next, the reconstructed wafer is diced to form the memory cores, and each memory core includes one memory module 100 and one logic chip 3.

Referring to FIG. 2, there is provided a substrate 9, which has a power supply port 92. The memory module 100 is fixed to the substrate 9, where the first direction X is parallel to the upper surface of the substrate 9. A lead frame 7 is provided, and the lead frame 7 is electrically connected to the solder bump 8 and the power supply port 92.

In some embodiments, the memory core is soldered on the substrate 9 by means of flip-chip bonding, and the lead frame 7 is soldered on the solder bump 8 on a top surface of the memory core. Next, the lead frame 7 is connected to the power supply port 92 by means of lead wire connection, to implement connection of the power supply signal between the memory chip 1 and the substrate 9. Next, the second sealing layer 52 covering the structures such as the memory module 100 and the lead frame 7 is formed by means of a second molding process.

It is worth noting that the molding process are used twice successively because the first molding process may be configured for connecting the plurality of memory modules 100 together, so the second wire layers 22 may be simultaneously formed on the plurality of memory modules 100 subsequently, which is advantageous to reducing the process steps. In addition, the volume of the single memory module 100 is smaller, but the total volume of the plurality of memory modules 100 connected together is increased, such that the stability is higher and falling does not easily occur. In addition, the first sealing layer 51 formed by means of the first molding process can protect and fix the memory module 100 in subsequent steps of forming the solder bump 8, performing flip-chip bonding, etc. to prevent the memory module 100 from collapsing or being damaged, which is advantageous to ensuring the performance of the memory module 100. In addition, the molding process performed twice successively can improve the sealing effect.

In conclusion, the memory cores are formed between the memory chips 1 of the multiple layers and the logic chip 3 in the vertically stacked manner, and then the power supply wiring layer 2 is led out to the substrate 9 via the lead frame 7 to be packaged. The signal communication between the memory chip 1 and the logic chip 3 is implemented in a wireless manner, which may effectively overcome the communication difficulty caused by the increase of the number of stacked layers of the memory chips 1 in parallel stacking, and ensure the reliability of power supply.

In the description of this specification, reference to the description of the terms "some embodiments", "for example", etc. means that a particular feature, structure, material or characteristic described in connection with this embodiment or example is included in at least one embodiment or example of the present disclosure. The schematic representation of the above terms throughout this specification is not necessarily referring to the same embodiment or example. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

Although the embodiments of the present disclosure have been shown and described above, it is to be understood that the above-mentioned embodiments are exemplary and should not be construed as limiting the present disclosure. Those of ordinary skill in the art may make changes, modifications, replacements and variations to the above embodiments without departing from the scope of the present disclosure. Therefore, all changes or embellishments made according to the claims and the specification of the present disclosure shall still fall within the scope covered by the patent of the present disclosure.

What is claimed is:

1. A semiconductor structure, the semiconductor structure comprises:
   a substrate having a power supply port;
   a memory module positioned on an upper surface of the substrate, the memory module comprising a plurality of memory chips stacked in a first direction, the first direction being parallel to the upper surface of the substrate,
   each of the plurality of memory chips having a power supply signal line, at least one of the plurality of memory chips having a power supply wiring layer, the power supply signal line being electrically connected to the power supply wiring layer,
   the power supply wiring layer being positioned in the memory module, an end surface of the power supply wiring layer far away from the substrate being exposed by the memory module, a solder bump being further provided on the end surface;
   a lead frame electrically connected to the solder bump and the power supply port, wherein the lead frame comprises a plurality of frame strips arranged at intervals, and the plurality of frame strips being arranged in a second direction, the second direction is perpendicular to the first direction and is parallel to the upper surface of the substrate;
   wherein each of the power supply wiring layers comprises a plurality of power supply wirings, and different power supply wirings having different voltages; and
   wherein different frame strips are connected to the power supply wirings having the different voltages.

2. The semiconductor structure according to claim 1, wherein
   the lead frame comprises support frames and a solder frame connected to each other;
   the support frames extend in a direction perpendicular to the upper surface of the substrate; and
   the solder frame extends in a direction parallel to the upper surface of the substrate and is soldered to the solder bump.

3. The semiconductor structure according to claim 2, wherein there are at least two support frames, and the at least two support frames are respectively positioned on two opposite sides of the memory module and are respectively connected to two opposite ends of the solder frame.

4. The semiconductor structure according to claim 2, wherein the lead frame further comprises extension frames connected to side surfaces of the support frames far away from the solder frame, a sectional area of each of the extension frames being larger than a sectional area of each of the support frames, and both sections of the extension frames and sections of the support frames are parallel to the upper surface of the substrate; and the semiconductor structure further comprises lead wires connected between the extension frames and the power supply port.

5. The semiconductor structure according to claim 2, further comprising power supply lines respectively connected to side surfaces of the support frames far away from the solder frame; wherein the substrate further has a first via penetrated, the first via serving as the power supply port; and the power supply lines are arranged in the first via.

6. The semiconductor structure according to claim 5, wherein a sectional area of each of the power supply lines is smaller than a sectional area of each of the support frames, and both sections of the power supply lines and sections of the support frames being parallel to the upper surface of the substrate.

7. The semiconductor structure according to claim 1, wherein a groove is further provided in the lead frame, the solder bump directly facing and being soldered to the groove.

8. The semiconductor structure according to claim 7, wherein an opening area of the groove is larger than a top surface area of the solder bump.

9. The semiconductor structure according to claim 1, wherein each of the plurality of power supply wirings comprises a ground wiring and a power wiring, each of the plurality of frame strips comprising a ground frame strip and a power frame strip, the ground frame strip being electrically connected to the ground wiring, the power frame strip being electrically connected to the power wiring, and the ground frame strip and the power frame strip being alternately arranged in the second direction.

10. The semiconductor structure according to claim 1, wherein the plurality of frame strips are arranged at equal intervals.

11. The semiconductor structure according to claim 1, wherein each of the plurality of memory chips has one power supply wiring layer, and the power supply wiring layer in each of the plurality of memory chips is correspondingly connected to the power supply signal line.

12. The semiconductor structure according to claim 1, wherein the solder bump comprises a first bump and a second bump arranged in stack; the first bump is connected to the power supply wiring layer; the second bump is soldered to the lead frame; and a sectional area of the first bump is larger than a sectional area of the second bump, and both a section of the first bump and a section of the second bump are parallel to the upper surface of the substrate.

13. The semiconductor structure according to claim 12, wherein in the first direction, a ratio of a width of the first bump to a width of each of the plurality of memory chips ranges from 0.8 to 1.2.

14. The semiconductor structure according to claim 1, further comprising: a logic chip positioned between the substrate and the memory module, the logic chip having a first wireless communication portion; wherein each of the plurality of memory chips has a second wireless communication portion, and the second wireless communication portion is configured to perform wireless communication with the first wireless communication portion.

15. A method for fabricating a semiconductor structure, comprising:

providing a substrate having a power supply port;

providing a memory module, the memory module comprising a plurality of memory chips stacked in a first direction, each of the plurality of memory chips having a power supply signal line, at least one of the plurality of memory chips having a power supply wiring layer, the power supply signal line being electrically connected to the power supply wiring layer, the power supply wiring layer being positioned in the memory module, an end surface of the power supply wiring layer far away from the substrate being exposed by the memory module, a solder bump being further provided on the end surface;

fixing the memory module to the substrate, the first direction being parallel to the upper surface of the substrate;

providing a lead frame, and electrically connecting the lead frame to the solder bump and the power supply port, wherein the lead frame comprises a plurality of frame strips arranged at intervals, and the plurality of frame strips being arranged in a second direction, the second direction is perpendicular to the first direction and is parallel to the upper surface of the substrate;

wherein each of the power supply wiring layers comprises a plurality of power supply wirings, and different power supply wirings having different voltages; and wherein different frame strips are connected to the power supply wirings having the different voltages.

\* \* \* \* \*